United States Patent
Zhou

(10) Patent No.: US 12,453,254 B2
(45) Date of Patent: Oct. 21, 2025

(54) DISPLAY PANEL, METHOD FOR MANUFACTURING DISPLAY PANEL, AND DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventor: Libin Zhou, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 577 days.

(21) Appl. No.: 17/816,406

(22) Filed: Jul. 30, 2022

(65) Prior Publication Data

US 2024/0008317 A1    Jan. 4, 2024

(30) Foreign Application Priority Data

Jun. 30, 2022  (CN) .......................... 202210766516.1

(51) Int. Cl.
*H10K 59/124*  (2023.01)
*H10K 59/12*  (2023.01)
(Continued)

(52) U.S. Cl.
CPC ......... *H10K 59/124* (2023.02); *H10K 59/126* (2023.02); *H10K 59/131* (2023.02); *H10K 71/00* (2023.02); *H10K 59/1201* (2023.02)

(58) Field of Classification Search
CPC .. H10K 59/124; H10K 59/126; H10K 59/131; H10K 59/1201; H10K 59/80522;
(Continued)

(56) References Cited

U.S. PATENT DOCUMENTS 10,749,134 B2 *  8/2020  Yamamoto ............. H10K 59/12
11,997,904 B2 *  5/2024  Sugisawa ............. H10K 59/124
(Continued)

FOREIGN PATENT DOCUMENTS

CN    113889487 A    1/2022
CN    114664912 A    6/2022

OTHER PUBLICATIONS

Chinese Office Action issued in corresponding Chinese Patent Application No. 202210766516.1 dated Feb. 26, 2025, pp. 1-7.

*Primary Examiner* — Dao H Nguyen
(74) *Attorney, Agent, or Firm* — PV IP PC; Wei Te Chung

(57) ABSTRACT

The present application provides a display panel, a method for manufacturing the display panel, and a display device, including: a substrate; a pixel driving circuit layer located on the substrate, comprising a pixel driving circuit; an auxiliary conductive portion disposed on the substrate; a passivation layer comprising a first passivation layer and a second passivation layer, the first passivation layer formed on the pixel driving circuit layer and the auxiliary conductive portion, and the second passivation layer formed on the first passivation layer so that the second passivation layer and the first passivation layer together define an undercut opening; a first electrode formed on the passivation layer, and electrically connected to the pixel driving circuit; a second electrode formed on the first electrode; the second electrode is connected in parallel with the auxiliary conductive portion through the undercut opening.

20 Claims, 4 Drawing Sheets

(51) Int. Cl.
　　　*H10K 59/126*　　(2023.01)
　　　*H10K 59/131*　　(2023.01)
　　　*H10K 71/00*　　　(2023.01)

(58) Field of Classification Search
　　　CPC ........ H10K 59/12; H10K 71/00; H10K 71/20;
　　　　　　　H10K 50/80; H10K 50/84; H10K 50/824
　　　See application file for complete search history.

(56) References Cited

U.S. PATENT DOCUMENTS

| | | | |
|---|---|---|---|
| 12,159,576 B2 * | 12/2024 | Kim | G09G 3/3233 |
| 2014/0225071 A1 * | 8/2014 | Park | H10K 59/131 |
| | | | 438/34 |
| 2021/0181554 A1 * | 6/2021 | Hong | G02F 1/1368 |
| 2024/0431194 A1 * | 12/2024 | Park | H10K 59/131 |

* cited by examiner

DISPLAY PANEL, METHOD FOR MANUFACTURING DISPLAY PANEL, AND DISPLAY DEVICE

CROSS-REFERENCE TO RELATED APPLICATION

The present application claims priority to Chinese patent application No. 202210766516.1, filed on Jun. 30, 2022, and titled "DISPLAY PANEL, METHOD FOR MANUFACTURING DISPLAY PANEL, AND DISPLAY DEVICE", which is incorporated by reference in the present application in its entirety.

FIELD OF INVENTION

The present application relates to a technical field of display, and especially to a display panel, a method for manufacturing the display panel, and a display device.

BACKGROUND OF INVENTION

In current organic light-emitting diode (OLED) display devices, there are top-emitting and bottom-emitting developing products. Among the current top-emitting developing products, a cathode is made of entire surface metal. In order to increase transmittance of light, a cathode layer needs to be manufactured as thin as possible, but a thinner cathode layer results in greater resistance of the cathode layer. When a signal is given to the cathode layer from an edge of a panel, voltage drop (IR Drop) will gradually increase from the edge of the panel to a middle of the panel. This causes a phenomenon that the edge is brighter and the middle is darker after the panel is lit, especially in large-sized displays, which is one of the problems that large-sized OLED displays need to overcome at present.

SUMMARY OF INVENTION

The present application provides a display panel to solve a problem that resistance of a cathode layer increases because the cathode layer is manufactured to be thinner, after the cathode layer is given a signal from an edge of a panel, IR voltage drop gradually increases from the edge of the panel to a middle of the panel, as a result, after the panel is lit, the edge is brighter and the middle is darker.

For solving the above problems, the technical solutions provided by the present application are as follows:

A display panel, comprising:
  a substrate;
  a pixel driving circuit layer, located on the substrate, comprising a pixel driving circuit;
  an auxiliary conductive portion, disposed on the substrate;
  a passivation layer, comprising a first passivation layer and a second passivation layer, the first passivation layer formed on the pixel driving circuit layer and the auxiliary conductive portion, and the second passivation layer formed on the first passivation layer so that the second passivation layer and the first passivation layer together define an undercut opening;
  a first electrode, formed on the passivation layer, and electrically connected to the pixel driving circuit;
  a second electrode, formed on the first electrode; and
  a common layer, located between the first electrode and the second electrode;
    wherein the common layer is disconnected in the undercut opening, and the second electrode is connected in parallel with the auxiliary conductive portion through the undercut opening.

According to a preferred embodiment of the present application, an etching rate of the second passivation layer is less than an etching rate of the first passivation layer under same etching conditions.

According to a preferred embodiment of the present application, an etching rate ratio of the first passivation layer to the second passivation layer is greater than or equal to 10.

According to a preferred embodiment of the present application, a material of the first passivation layer is $SiO_x$, and a material of the second passivation layer is $SiN_x$.

According to a preferred embodiment of the present application, the passivation layer further comprises a third passivation layer, the third passivation layer is formed on the second passivation layer, and the material of the first passivation layer is same as a material of the third passivation layer.

According to a preferred embodiment of the present application, the pixel driving circuit layer comprises a first conductive layer, the pixel driving circuit comprises a TFT, and the first conductive layer comprises a source electrode and a drain electrode of the TFT arranged in a same layer, and the auxiliary conductive portion.

According to a preferred embodiment of the present application, the pixel driving circuit layer further comprises a light-shielding layer, and the light-shielding layer comprises a light-shielding portion and a conductive line arranged in a same layer, the light-shielding portion is located between an active pattern of the TFT and the substrate and at least partially overlaps with the active pattern, and the conductive line is electrically connected to the auxiliary conductive portion.

The present application further provides a method for manufacturing a display panel, comprising:
  forming a pixel driving circuit layer on a substrate, the pixel driving circuit layer comprising a pixel driving circuit;
  forming an auxiliary conductive portion on the substrate;
  forming a passivation layer, the passivation layer comprising a first passivation layer and a second passivation layer, the first passivation layer formed on the pixel driving circuit layer and the auxiliary conductive portion, and the second passivation layer formed on the first passivation layer;
  patterning the first passivation layer and the second passivation layer so that the second passivation layer and the first passivation layer together define an undercut opening;
  forming a first electrode on the passivation layer, the first electrode electrically connected to the pixel driving circuit;
  forming a common layer on the first electrode, the common layer disconnected in the undercut opening;
  forming a second electrode on the common layer, and the second electrode connected in parallel with the auxiliary conductive portion through the undercut opening.

According to a preferred embodiment of the present application, the step of patterning the first passivation layer and the second passivation layer comprises:
  patterning the first passivation layer and the second passivation layer, so that the second passivation layer and the first passivation layer together define a connection opening;
  forming a planarization layer on the first passivation layer and the second passivation layer;

patterning the planarization layer, the first passivation layer, and the second passivation layer;

wherein an etching rate of the second passivation layer under a condition of hydrofluoric acid solution is less than an etching rate of the first passivation layer under a condition of hydrofluoric acid solution, so that the second passivation layer and the first passivation layer together define the undercut opening.

The present application further provides a display device, comprising any one of the above described display panels or any one of the display panels manufactured by the above described methods.

Beneficial effects of the present application are as follows: in the present application, by arranging the auxiliary conductive portion and defining the undercut opening in the passivation layer, the second electrode is electrically connected to the auxiliary conductive portion, so that the second electrode can obtain sufficient power from the display panel for supporting, reduce the voltage drop, so as to solve the problem that the edge is brighter and the middle is darker after the display panel is lit.

DETAILED DESCRIPTION OF PREFERRED EMBODIMENTS

The technical solutions in the embodiments of the present disclosure will be clearly and completely described below with reference to the drawings in the embodiments of the present disclosure. Obviously, the described embodiments are only a part of the embodiments of the present disclosure, but not all of the embodiments. Based on the embodiments in the present disclosure, all other embodiments obtained by those skilled in the art without creative work fall within the protection scope of the present disclosure.

Figure 7:
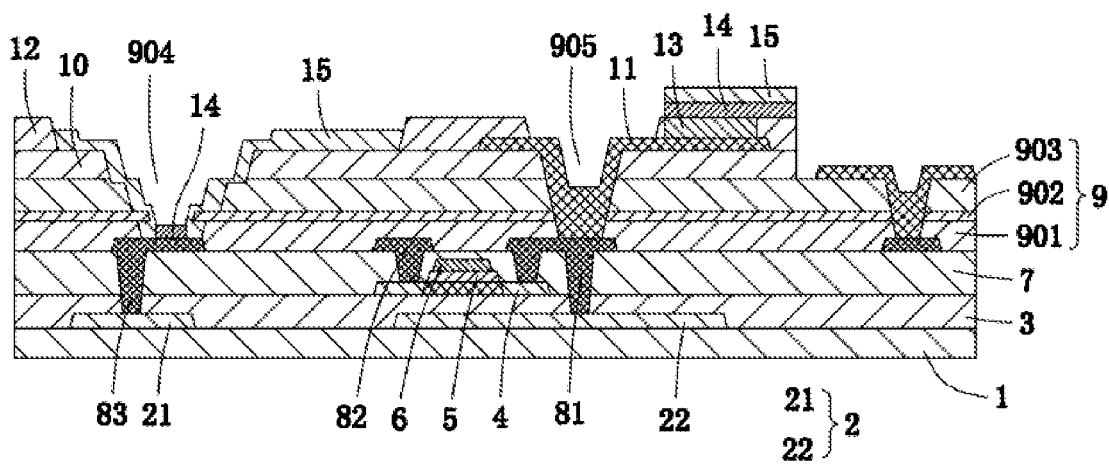
FIG. 7 is a seventh schematic structural diagram corresponding to a step in the method for manufacturing the display panel of the present application.

Referring to FIG. 7, an embodiment of the present application provides a display panel comprising a substrate 1, a pixel driving circuit layer, an auxiliary conductive portion 83, a passivation layer 9, a first electrode 11, a second electrode 15, and a common layer 14. Exemplarily, the display panel is an OLED display panel.

The substrate 1 may comprise a single-layer insulating material such as glass, quartz, and polymer resin, or a multi-layer insulating material such as double-layer polymer resin. The substrate 1 may be a rigid substrate or a flexible substrate, and it can be known that the substrate 1 is used to carry a film layer disposed thereon.

The pixel driving circuit layer is located on the substrate 1 and comprises a pixel driving circuit. The pixel driving circuit comprises a plurality of thin film transistors and capacitors for driving sub-pixels of the display panel.

The auxiliary conductive portion 83 is arranged on the substrate 1 and is used to electrically connect to a signal line. It can be known that the signal line comprises a VSS signal line providing a voltage signal to a cathode.

The passivation layer 9 comprises a first passivation layer 901 and a second passivation layer 902. The first passivation layer 901 is formed on the pixel driving circuit layer and the auxiliary conductive portion 83. The second passivation layer 902 is formed on the first passivation layer 901, and the second passivation layer 902 and the first passivation layer 901 together define an undercut opening 904 and a connection opening 905. It can be known that the undercut opening 904 can be defined by an undercut process, so that the second passivation layer 902 protrudes from the first passivation layer 901 in the undercut opening 904, that is, the second passivation layer 902 is closer to a center of the undercut opening 904 than the first passivation layer 901.

The first electrode 11 is formed on the passivation layer and is electrically connected to the pixel driving circuit through the connection opening 905. The second electrode 15 is formed on the first electrode 11. The common layer 14 is located between the first electrode 11 and the second electrode 15. Wherein the common layer 14 is disconnected in the undercut opening 904, and the second electrode 15 is connected in parallel with the auxiliary conductive portion 83 through the undercut opening 904, that is, connected with the auxiliary conductive portion 83, and then electrically connected to a signal line electrically connected to the auxiliary conductive portion 83. It can be known that, in the present embodiment, the first electrode 11 is an anode, and a driving voltage is provided by the pixel driving circuit. The second electrode 15 is the cathode, and is electrically connected to a VSS signal line of the display panel. The common layer 14 comprises a hole injection/transport layer and/or an electron injection/transport layer, and a light-emitting layer 13 is further disposed in middle of the common layer 14. The first electrode 11 and the second electrode 15 cause the light-emitting layer 13 to emit light through the common layer 14.

The present embodiment provides a display panel. By arranging an auxiliary conductive portion 83 and electrically connecting the auxiliary conductive portion 83 to the VSS signal line, and defining the undercut opening 904 in the passivation layer, so that the second electrode 15 is electrically connected to the auxiliary conductive portion 83, and the second electrode 15 can obtain sufficient voltage from the display panel to support and reduce voltage drop, a problem that after the display panel is lit, an edge of the display panel is brighter and a middle is darker is solved.

As shown in FIG. 7, in an embodiment of the present application, the undercut opening 904 is defined by an undercut process, so that the second passivation layer 902 protrudes from the first passivation layer 901 in the undercut opening 904. That is, the second passivation layer 902 is closer to a center of the undercut opening 904 than the first passivation layer 901. This structure can prevent the common layer 14 from completely covering the auxiliary conductive portion 83 exposed in the undercut opening 904 during a formation process of the common layer 14 due to characteristics of the common layer 14, thereby ensuring that the second electrode 15 can maintain good contact with the auxiliary conductive portion 83. Therefore, under same etching conditions, an etching rate of the second passivation layer 902 is less than an etching rate of the first passivation layer 901. For example, the etching rate ratio of the first passivation layer 901 to the second passivation layer 902 can be made to be greater than or equal to 10, and the etching rate ratio of the first passivation layer 901 to the second passivation layer is 10, 13, or 15, etc. The ratio can be set according to actual requirements, and should not be limited to values described in the embodiments. It can be known that the passivation layer comprises inorganic insulating substances such as silicon oxide, silicon nitride, silicon oxynitride, hafnium oxide, aluminum oxide, titanium oxide, tantalum oxide, and zinc oxide. The passivation layer is formed on a display area and comprises at least a portion not formed on a non-display area. In the present embodiment, a material of the first passivation layer 901 is $SiO_x$, and a material of the second passivation layer 902 is $SiN_x$. It can be known that when the material of the second passivation layer 902 is $SiN_x$, since the material of $SiN_x$ will generate H ions in some working conditions, therefore a use of the $SiO_x$ in the first passivation layer 901 can prevent the H ions released in the second passivation layer 902 from affecting a film layer located under the first passivation layer 901.

Specifically, a distance between the second passivation layer 902 and the auxiliary conductive portion 83 is at least 0.2 μm, such as 0.3 μm, and a width of the undercut opening 904 is at least 3 μm, such as 3.5 μm.

Figure 6:
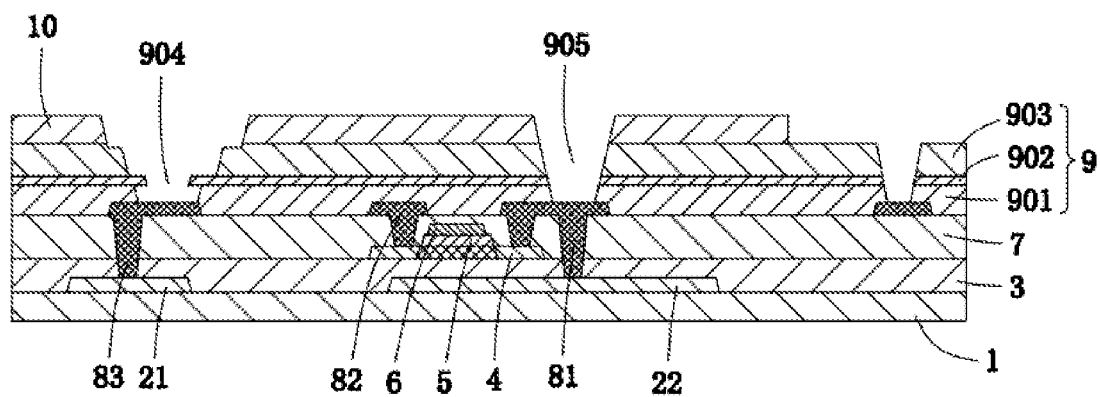
FIG. 6 is a sixth schematic structural diagram corresponding to a step in the method for manufacturing the display panel of the present application.

As shown in FIG. 6, in an embodiment of the present application, the passivation layer further comprises a third passivation layer 903, and the third passivation layer 903 is formed on the second passivation layer 902. Based on the above embodiment, the third passivation layer 903 can be made of same material as the first passivation layer 901. That is, the passivation layer comprises the first passivation layer 901, the second passivation layer 902, and the third passivation layer 903. The materials of the first passivation layer 901 and the third passivation layer 903 are both $SiO_x$, and the material of the second passivation layer 902 is SiNx. This arrangement can prevent the H ions released in the second passivation layer 902 from affecting IGZO and an OLED device. In addition, there is no requirement to form an undercut opening 904 between the third passivation layer 903 and the second passivation layer 902, that is, only a common opening is required. Therefore, the etching rate of the third passivation layer 903 and the etching rate of the second passivation layer 902 do not need to be especially set, for example, the etching rate of the first passivation layer 901 can be same as the etching rate of the third passivation layer 903.

It can be known that, as shown in FIG. 7, a planarization layer 10 is further disposed between the passivation layer and the first electrode 11, and the planarization layer 10 is disposed on the third passivation layer 903. Since a thickness of the planarization layer 10 is generally great, it can be used to provide a flat surface for deposition of the first electrode 11. Based on above purposes, the planarization layer 10 comprises inorganic insulating substances or polyacrylate resin, epoxy resin, phenolic resin, polyamides resin, polyamide resin, unsaturated polyester resin, polyphenylene ether resin, polyphenylene sulfide resin, or benzocyclobutene and other organic insulating substances. The planarization layer 10 may also comprise a photosensitive substance, but is not limited thereto.

Figure 5:
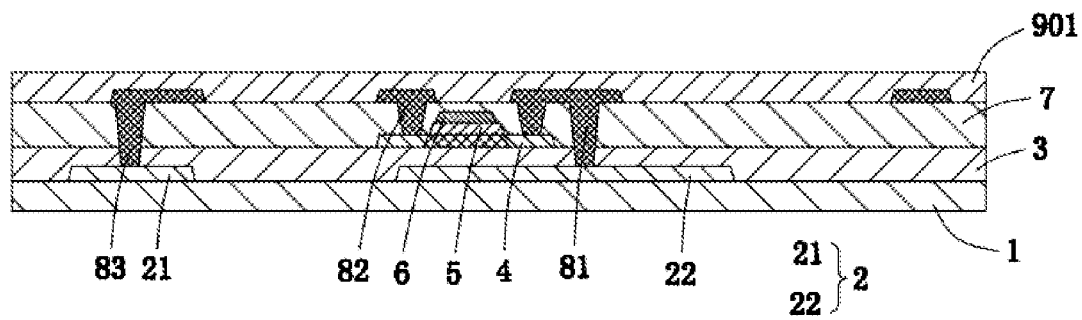
FIG. 5 is a fifth schematic structural diagram corresponding to a step in the method for manufacturing the display panel of the present application.

As shown in FIG. 5, in an embodiment of the present application, the pixel driving circuit comprises a thin film transistor (TFT). The TFT comprises a source electrode 82, a drain electrode 81, a gate electrode 6, a gate insulating layer 5, and an active layer 4. The active layer 4 is located on the substrate 1, the gate insulating layer 5 is located on the active layer 4, and the gate electrode 6 is located on the gate insulating layer 5. The pixel driving circuit layer comprises a first conductive layer, the first conductive layer is located on the gate electrode 6, and the first conductive layer comprises the source electrode 82 and the drain electrode 81 of the TFT, and the auxiliary conductive layer portion 83. It can be known that an interlayer insulating layer 7 is disposed between the first conductive layer and the active layer 4, the gate insulating layer 5, and the gate electrode 6. A plurality of first openings are defined on the interlayer insulating layer 7, and the source electrode 82 and the drain electrode 81 are connected to the active layer 4 through the first openings.

In an embodiment of the present application, the pixel driving circuit layer further comprises a light-shielding layer 2, and the light-shielding layer 2 comprises a light-shielding portion 22 and a conductive line 21 provided on a same layer. The light-shielding portion 22 is located between an active pattern of the TFT (i.e., the active layer 4) and the substrate 1, and at least partially overlaps with the active pattern. The conductive line 21 is electrically connected to the auxiliary conductive portion 83 and the VSS signal line for electrically connecting the second electrode 15 to the VSS signal line. It can be known that a buffer layer 3 is disposed between the active layer 4 and the light-shielding layer 2. A plurality of second openings are defined on the buffer layer 3 and the interlayer insulating layer 7. The auxiliary conductive portion 83 is connected to the conductive line 21 through the second openings, and the source electrode 82 or the drain electrode 81 is connected to the light-shielding portion 22 through the second openings. It can be known that the light-shielding layer 2 comprises one or more metals of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). In addition, the light-shielding layer 2 may be a single-layer film or a multi-layer film.

Figure 8:
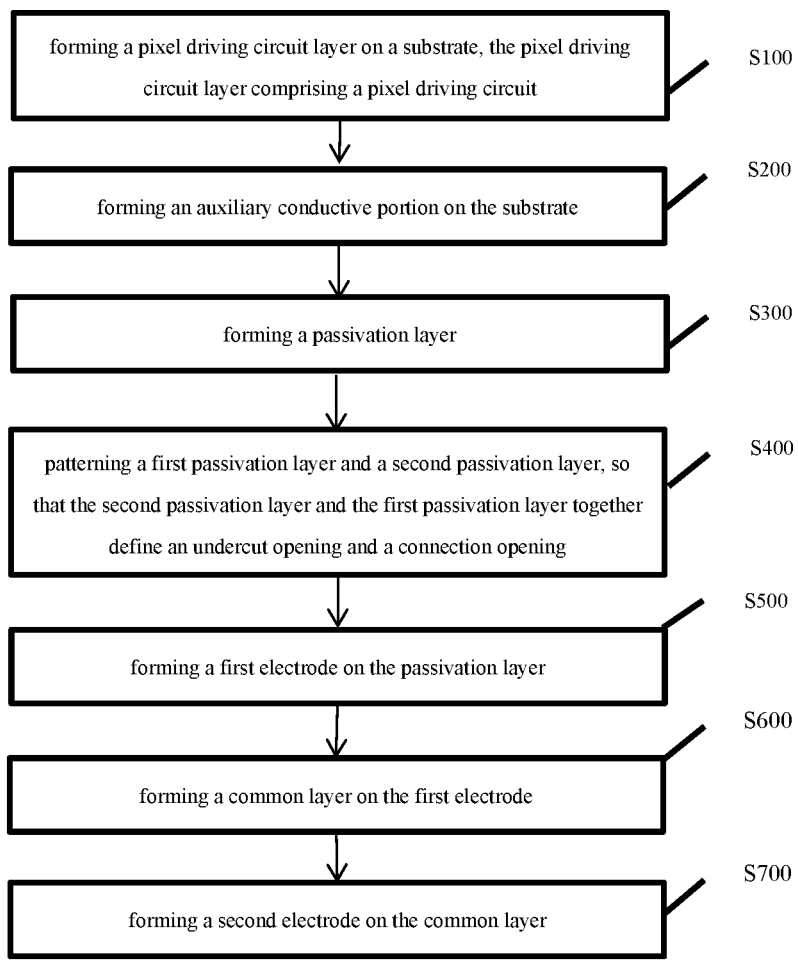
FIG. 8 is a flowchart of the method for manufacturing the display panel of the present application.
Figure 9:
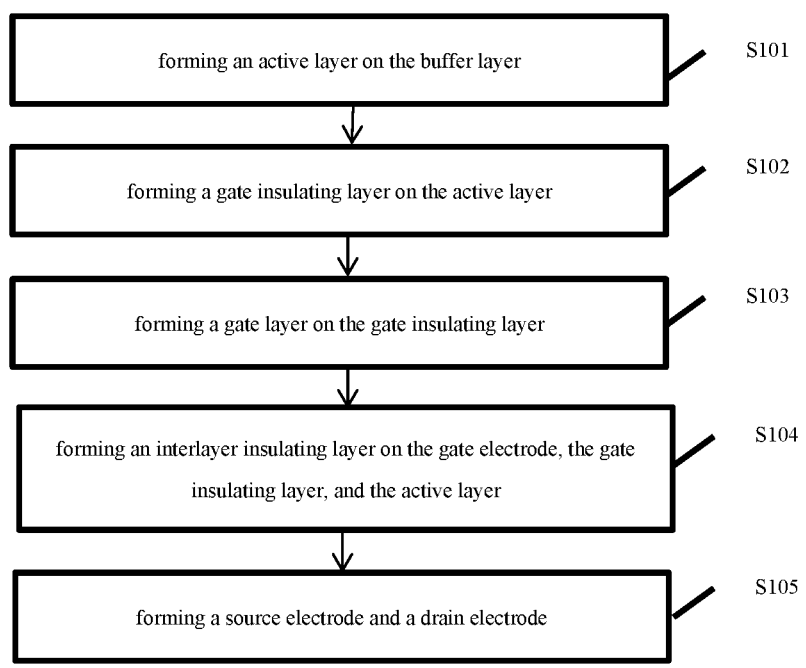
FIG. 9 is a flowchart corresponding to step S100 in the method for manufacturing the display panel of the present application.

As shown in FIG. 8, the present embodiment provides a method for manufacturing a display panel, comprising:

S100, forming a pixel driving circuit layer on a substrate 1, the pixel driving circuit layer including a pixel driving circuit;

S200, forming an auxiliary conductive portion 83 on the substrate 1; S300, forming a passivation layer 9, the passivation layer 9 comprising a first passivation layer 901 and a second passivation layer 902, and the first passivation layer 901 formed on the pixel driving circuit layer and the auxiliary conductive portion 83, the second passivation layer 902 formed on the first passivation layer 901;

S400, patterning the first passivation layer 901 and the second passivation layer 902, so that the second passivation layer 902 and the first passivation layer 901 together define an undercut opening 904 and a connection opening 905;

S500, forming a first electrode 11 on the passivation layer 9, and the first electrode 11 electrically connected to the pixel driving circuit through the connection opening 905;

S600, forming a common layer 14 on the first electrode 11, and the common layer 14 disconnected in the undercut opening 904;

S700, forming a second electrode 15 on the common layer 14, and the second electrode 15 connected in parallel with the auxiliary conductive portion 83 through the undercut opening 904.

Figure 1:
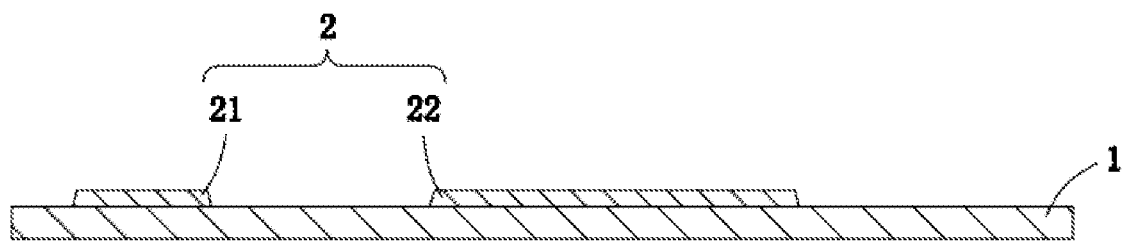
FIG. 1 is a first schematic structural diagram corresponding to a step in a method for manufacturing a display panel of the present application.

Specifically, as shown in FIG. 1, before the step S100, the method also comprises S001. A light-shielding layer 2 and a buffer layer 3 are formed on the substrate 1, and the light-shielding layer 2 comprises a conductive line 21 and a light-shielding portion 22. The first light shielding layer 2 can be formed by using a physical vapor sputtering deposition method. The light-shielding layer 2 comprises one or more metals of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The light shielding layer 2 may be a single-layer film or a multi-layer film.

Figure 2:
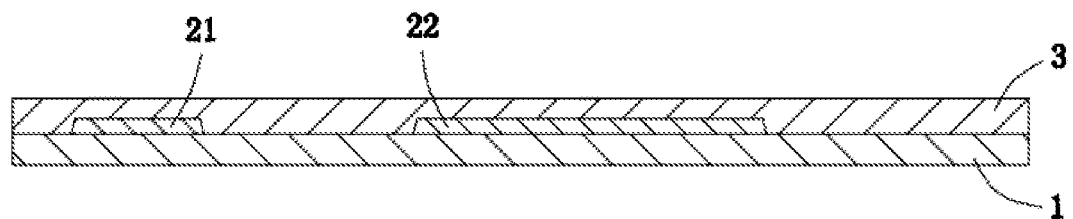
FIG. 2 is a second schematic structural diagram corresponding to a step in the method for manufacturing the display panel of the present application.
Figure 3:
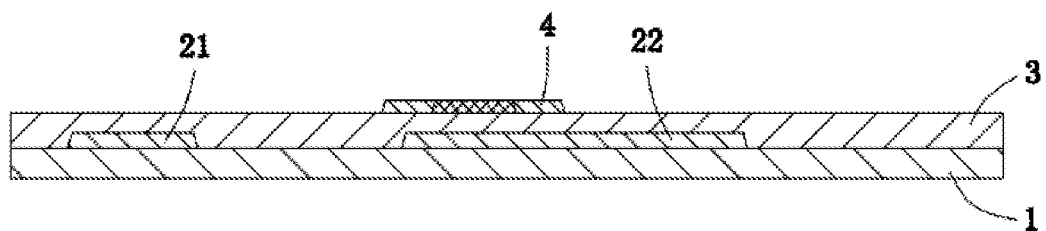
FIG. 3 is a third schematic structural diagram corresponding to a step in the method for manufacturing the display panel of the present application.
Figure 4:
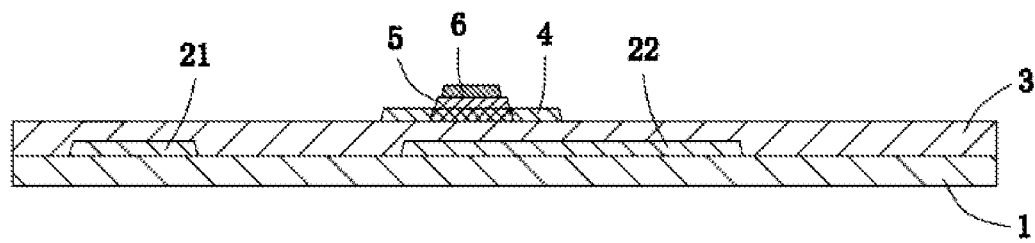
FIG. 4 is a fourth schematic structural diagram corresponding to a step in the method for manufacturing the display panel of the present application.

As shown in FIG. 2, the buffer layer 3 is formed on the conductive line 21 and the light-shielding portion 22. Specifically, a chemical vapor deposition method can be used to form the buffer layer 3. The buffer layer 3 may comprise a single-layer film of insulating film such as silicon nitride $(SiN_x)$ or silicon oxide $(SiO_x)$ or a multi-layer film laminated with silicon nitride $(SiN_x)$ and silicon oxide $(SiO_x)$. The buffer layer 3 is used to prevent permeation of unnecessary components such as impurities or moisture.

As shown in FIG. 3, FIG. 4, FIG. 5, and FIG. 9, in S100, forming the pixel driving circuit layer on the substrate 1, comprises:

S101, forming an active layer 4 on the buffer layer 3, specifically, forming an oxide semiconductor layer by the physical vapor sputtering deposition method, and forming the active layer 4 by patterning the oxide semiconductor layer. The oxide semiconductor may comprise an oxide based on one of titanium (Ti), hafnium (Hf), zirconium (Zr), aluminum (Al), tantalum (Ta), germanium (Ge), zinc (Zn), gallium (Ga), tin (Sn) or indium (In) or any one of their complex oxides. The active layer 4 may comprise a semiconductor pattern, and the semiconductor pattern may comprise: a channel region, overlapping a gate electrode 6 in a thickness direction; a first source 82/drain 81 region and a second source 82/drain 81 region, respectively located on one side and another side of the channel region. The first source 82/drain 81 region and the second source 82/drain 81 region are conductive regions, and may have higher conductivity and lower resistance than the channel region.

S102, forming a gate insulating layer 5 on the active layer 4, specifically, forming the gate insulating layer 5 by the chemical vapor deposition method. The gate insulating layer 5 may comprise silicon oxide, silicon nitride, silicon oxynitride, aluminum oxide, tantalum oxide, hafnium oxide, zirconium oxide, and titanium oxide, etc., and these substances may be used alone or used in combination with each other.

S103, forming a gate electrode layer on the gate insulating layer 5. The gate electrode layer comprises a gate electrode 6, and the gate electrode 6 may be formed of a low-resistance material. The gate electrode 6 may comprise more than one of metals selected from molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu), but not limited to these.

S104, forming an interlayer insulating layer 7 on the gate electrode 6, the gate insulating layer 5, and the active layer 4. The interlayer insulating layer 7 can not only cover an upper surface of the gate electrode 6, but also cover a side surface of the gate electrode 6. The interlayer insulating layer 7 may comprise silicon compounds, metal oxides, and the like. For example, the interlayer insulating layer 7 may comprise silicon oxide, silicon nitride, silicon oxynitride, aluminum oxide, tantalum oxide, hafnium oxide, zirconium oxide, titanium oxide, or the like.

S105, forming a source electrode 82 and a drain electrode 81, opening the interlayer insulating layer 7 by a photolithography process to form a plurality of first openings and a plurality of second openings, and then forming the source electrode 82 and the drain electrode 81 by using a physical vapor deposition method. The source electrode 82 and the drain electrode 81 are connected to the active layer 4 through the first openings, and the source electrode 82 or the drain electrode 81 is connected to the light-shielding portion 22 through the second openings. The source electrode and the drain electrode may comprise more than one of metals selected from molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu).

The S200, forming the auxiliary conductive portion 83 on the substrate 1, comprises: forming the auxiliary conductive portion 83 by the physical vapor deposition method. The auxiliary conductive portion 83 is connected to the conductive line 21 through the second opening. The auxiliary conductive portion 83 can be made of same material as the source electrode 82 and the drain electrode 81. The auxiliary conductive portion 83, the source electrode 82, and the drain electrode 81 together constitute a first metal layer. It should be noted that the first metal layer is not limited to the above three.

S300, forming the passivation layer 9, comprises:

S301, forming the first passivation layer 901 on the auxiliary conductive portion 83, the source electrode 82, the drain electrode 81, and the interlayer insulating layer 7. In the present embodiment, a material of the first passivation layer 901 may be $SiO_x$, such as SiO and $SiO_2$. Specifically, the first passivation layer 901 may be formed by the chemical vapor deposition method. In the present embodiment, film-forming gas can be $SiH_4$, $N_2O$, and other gases, and density and thickness of the first passivation layer 901 can be adjusted by a film-forming process so as to adjust an etching rate of the first passivation layer 901.

S302, forming the second passivation layer 902 on the first passivation layer 901. In the present embodiment, a material of the first passivation layer 901 may be $SiN_x$, such as SiN. Specifically, the second passivation layer 902 can be formed by the chemical vapor deposition method. In the present embodiment, film-forming gas can be $SiH_4$, $NH_3$, $N_2$, or other gases, and density of the second passivation layer 902 can be adjusted by the film-forming process, so that the higher its density is, the better. Specifically, an etching rate ratio of the first passivation layer 901 to the second passivation layer 902 may be greater than or equal to 10. It can be known that the etching rate of the first passivation layer 901 and the second passivation layer 902 can be regulated by adjusting the density and the thickness of the corresponding film layer, and concentration and action time of acid. This is conventional technical means of those skilled in the art, and will not be repeated here. In the preset embodiment, hydrofluoric acid (HF acid) is used to etch the first passivation layer 901 and the second passivation layer 902.

Optionally, based on the above content, the step S300 may further comprise 5303, forming a third passivation layer 903 on the second passivation layer 902. A formation process and a material of the third passivation layer 903 are same as those of the first passivation layer 901, and will not be described again. The third passivation layer 903 prevents H ions released from the second passivation layer 902.

S400, patterning the first passivation layer 901 and the second passivation layer 902, so that the second passivation layer 902 and the first passivation layer 901 together define the undercut opening 904, comprises:

S401, patterning the first passivation layer 901, the second passivation layer 902, and the third passivation layer 903, so that the first passivation layer 901, the second passivation layer 902, and the third passivation layer 903 together define a plurality of connection openings 905;

S402, forming the planarization layer 10 on the third passivation layer 903, and patterning the planarization layer 10, the first passivation layer 901, the second passivation layer 902, and the third passivation layer 903. Specifically, an undercutting process is used to etch the passivation layer with HF to define the undercut opening 904.

S500, forming a first electrode 11 on the passivation layer. Part of the first electrode 11 is formed in the connection opening 905, and the first electrode 11 is electrically connected to the pixel driving circuit through the connection opening 905, that is, the source electrode 82 or the drain electrode 81 of the TFT. The first electrode 11 may be a laminated film structure having a layer of matter with a higher work function of laminated indium-tin oxide (ITO), indium-zinc oxide (IZO), zinc oxide (ZnO), indium oxide ($In_2O_3$) and a layer of matter such as silver (Ag), magnesium (Mg), aluminum (Al), platinum (Pt), palladium (Pd), gold (Au), nickel (Ni), neodymium (Nd), iridium (Jr), chromium (Cr), lithium (Li), calcium (Ca) or reflective material layers of a mixture thereof, but are not limited to these.

S600, forming the common layer 14 on the first electrode 11. Part of the common layer 14 is formed in the undercut opening 904, and due to material properties and manufacturing process of the common layer 14, the common layer 14 is disconnected in the undercut opening 904. That is, the common layer 14 will not completely cover the auxiliary conductive portion 83 exposed in the undercut opening 904. The common layer 14 comprises a hole injection/transport layer and/or an electron injection/transport layer, a light-emitting layer 13 is formed in a middle of the common layer 14, and the first electrode 11 and the second electrode 15 act on the common layer 14 to cause the light-emitting layer 13 to emit light. A preparation method of the common layer 14 and the first electrode 11 belongs to conventional technical means of those skilled in the art, and will not be repeated here. It can be known that a pixel definition layer 12 is also formed on the first electrode 11, and the pixel definition layer 12 is used to separate adjacent sub-pixels of different colors, and position and preparation method thereof are not described here.

S700, forming a second electrode 15 on the common layer 14. The second electrode can be formed by an evaporation process, and part of the second electrode 15 is formed in the undercut opening 904. Due to material characteristics and forming process of the second electrode 15, part of the second electrode 15 can be connected in parallel with the auxiliary conductive portion 83 through the undercut opening 904. The second electrode 15 may comprise, for example, Li, Ca, LiF/Ca, LiF/Al, Al, Mg, Ag, Pt, Pd, Ni, Au, Nd, Ir, Cr, BaF2, and Ba, or compounds or mixtures thereof.

An embodiment of the present application further provides a display device, comprising the display panel described in the above embodiment or the display panel manufactured by the above method.

In summary, although the present application has been disclosed above with preferred embodiments, the above preferred embodiments are not intended to limit the present application. Those of ordinary skill in the art can make various changes and modifications without departing from the spirit and scope of the present application. Therefore, the protection scope of the present application is subject to the scope defined by the claims.

What is claimed is:

1. A display panel, comprising:
a substrate;
a pixel driving circuit layer, located on the substrate, comprising a pixel driving circuit;
an auxiliary conductive portion, disposed on the substrate;
a passivation layer, comprising a first passivation layer and a second passivation layer, the first passivation layer being formed on the pixel driving circuit layer and the auxiliary conductive portion, and the second passivation layer being formed on the first passivation layer so that the second passivation layer and the first passivation layer together define an undercut opening;
a first electrode, formed on the passivation layer, and electrically connected to the pixel driving circuit;
a second electrode, formed on the first electrode, the auxiliary conductive portion being configured to electrically connect to a VSS signal line providing a voltage signal for the second electrode; and
a common layer, located between the first electrode and the second electrode;
wherein the common layer is disconnected in the undercut opening, and the second electrode is connected in parallel with the auxiliary conductive portion through the undercut opening.

2. The display panel as claimed in claim 1, wherein an etching rate of the second passivation layer is less than an etching rate of the first passivation layer under same etching conditions.

3. The display panel as claimed in claim 2, wherein an etching rate ratio of the first passivation layer to the second passivation layer is greater than or equal to 10.

4. The display panel as claimed in claim 2, wherein a material of the first passivation layer is $SiO_x$, and a material of the second passivation layer is $SiN_x$.

5. The display panel as claimed in claim 4, wherein the passivation layer further comprises a third passivation layer, the third passivation layer is formed on the second passivation layer, and the material of the first passivation layer is same as a material of the third passivation layer.

6. The display panel as claimed in claim 1, wherein the pixel driving circuit layer further comprises a first conductive layer, the pixel driving circuit comprises a TFT, and the first conductive layer comprises a source electrode and a drain electrode of the TFT arranged in a same layer, and the auxiliary conductive portion.

7. The display panel as claimed in claim 6, wherein the pixel driving circuit layer further comprises a light-shielding layer, and the light-shielding layer comprises a light-shielding portion and a conductive line arranged in a same layer, the light-shielding portion is located between an active pattern of the TFT and the substrate and at least partially overlaps with the active pattern, and the conductive line is electrically connected to the auxiliary conductive portion.

8. A method for manufacturing a display panel, comprising:
- forming a pixel driving circuit layer on a substrate, the pixel driving circuit layer comprising a pixel driving circuit;
- forming an auxiliary conductive portion on the substrate;
- forming a passivation layer, the passivation layer comprising a first passivation layer and a second passivation layer, the first passivation layer being formed on the pixel driving circuit layer and the auxiliary conductive portion, and the second passivation layer being formed on the first passivation layer;
- patterning the first passivation layer and the second passivation layer so that the second passivation layer and the first passivation layer together define an undercut opening;
- forming a first electrode on the passivation layer, the first electrode electrically being connected to the pixel driving circuit;
- forming a common layer on the first electrode, the common layer being disconnected in the undercut opening; and
- forming a second electrode on the common layer, the second electrode being connected in parallel with the auxiliary conductive portion through the undercut opening, and the auxiliary conductive portion being configured to electrically connect to a VSS signal line providing a voltage signal for the second electrode.

9. The method for manufacturing the display panel as claimed in claim 8, wherein the step of patterning the first passivation layer and the second passivation layer comprises:
- patterning the first passivation layer and the second passivation layer, so that the second passivation layer and the first passivation layer together define a connection opening;
- forming a planarization layer on the first passivation layer and the second passivation layer; and
- patterning the planarization layer, the first passivation layer, and the second passivation layer;
- wherein an etching rate of the second passivation layer under a condition of hydrofluoric acid solution is less than an etching rate of the first passivation layer under the condition of hydrofluoric acid solution, so that the second passivation layer and the first passivation layer together define the undercut opening.

10. The method for manufacturing the display panel as claimed in claim 9, wherein an etching rate ratio of the first passivation layer to the second passivation layer is greater than or equal to 10.

11. The method for manufacturing the display panel as claimed in claim 9, wherein a material of the first passivation layer is $SiO_x$, and a material of the second passivation layer is $SiN_x$.

12. The method for manufacturing the display panel as claimed in claim 8, wherein the pixel driving circuit layer further comprises a first conductive layer, the pixel driving circuit comprises a TFT, and the first conductive layer comprises a source electrode and a drain electrode of the TFT arranged in a same layer, and the auxiliary conductive portion.

13. The method for manufacturing the display panel as claimed in claim 12, wherein the pixel driving circuit layer further comprises a light-shielding layer, and the light-shielding layer comprises a light-shielding portion and a conductive line arranged in a same layer, the light-shielding portion is located between an active pattern of the TFT and the substrate and at least partially overlaps with the active pattern, and the conductive line is electrically connected to the auxiliary conductive portion.

14. A display device, comprising a display panel, and the display panel comprising:
- a substrate;
- a pixel driving circuit layer, located on the substrate, comprising a pixel driving circuit;
- an auxiliary conductive portion, disposed on the substrate;
- a passivation layer, comprising a first passivation layer and a second passivation layer, the first passivation layer being formed on the pixel driving circuit layer and the auxiliary conductive portion, and the second passivation layer being formed on the first passivation layer so that the second passivation layer and the first passivation layer together define an undercut opening;
- a first electrode, formed on the passivation layer, and electrically connected to the pixel driving circuit;
- a second electrode, formed on the first electrode, the auxiliary conductive portion being configured to electrically connect to a VSS signal line providing a voltage signal for the second electrode; and
- a common layer, located between the first electrode and the second electrode;
- wherein the common layer is disconnected in the undercut opening, and the second electrode is connected in parallel with the auxiliary conductive portion through the undercut opening.

15. The display device as claimed in claim 14, wherein an etching rate of the second passivation layer is less than an etching rate of the first passivation layer under same etching conditions.

16. The display device as claimed in claim 15, wherein an etching rate ratio of the first passivation layer to the second passivation layer is greater than or equal to 10.

17. The display device as claimed in claim 15, wherein a material of the first passivation layer is $SiO_x$, and a material of the second passivation layer is $SiN_x$.

18. The display device as claimed in claim 17, wherein the passivation layer further comprises a third passivation layer, the third passivation layer is formed on the second passivation layer, and the material of the first passivation layer is same as a material of the third passivation layer.

19. The display device as claimed in claim 14, wherein the pixel driving circuit layer further comprises a first conductive layer, the pixel driving circuit comprises a TFT, and the first conductive layer comprises a source electrode and a drain electrode of the TFT arranged in a same layer, and the auxiliary conductive portion.

20. The display device as claimed in claim 19, wherein the pixel driving circuit layer further comprises a light-shielding layer, and the light-shielding layer comprises a light-shielding portion and a conductive line arranged in a same layer, the light-shielding portion is located between an active pattern of the TFT and the substrate and at least partially overlaps with the active pattern, and the conductive line is electrically connected to the auxiliary conductive portion.

* * * * *